United States Patent
Otobe

(10) Patent No.: US 7,292,096 B2
(45) Date of Patent: Nov. 6, 2007

(54) AMPLIFIER

(75) Inventor: Eiichiro Otobe, Yokohama (JP)

(73) Assignee: Samsung Electronics Co., Ltd. (KR)

( * ) Notice: Subject to any disclaimer, the term of this patent is extended or adjusted under 35 U.S.C. 154(b) by 189 days.

(21) Appl. No.: 11/157,427

(22) Filed: Jun. 21, 2005

(65) Prior Publication Data

US 2006/0006935 A1      Jan. 12, 2006

(30) Foreign Application Priority Data

Jun. 21, 2004   (JP)   ............................. 2004-182341
Jun. 16, 2005   (KR)   ...................... 10-2005-0051774

(51) Int. Cl.
*H03F 1/14* (2006.01)
(52) U.S. Cl. ........................................ 330/51; 330/144
(58) Field of Classification Search ................. 330/51, 330/124 R, 144, 284
See application file for complete search history.

(56) References Cited

U.S. PATENT DOCUMENTS

| 5,548,246 A | 8/1996 | Yamamoto et al. | |
|---|---|---|---|
| 6,169,449 B1 * | 1/2001 | Hasegawa | ..................... 330/51 |
| 6,215,987 B1 * | 4/2001 | Fujita | ....................... 455/127.3 |
| 6,949,974 B2 * | 9/2005 | Ohnishi et al. | ......... 330/124 R |
| 2004/0108901 A1 * | 6/2004 | Apel et al. | .................. 330/285 |

FOREIGN PATENT DOCUMENTS

| JP | 2000-513544 | 10/2000 |
|---|---|---|
| JP | 2003-324323 | 11/2003 |

* cited by examiner

*Primary Examiner*—Robert Pascal
*Assistant Examiner*—Hieu Nguyen
(74) *Attorney, Agent, or Firm*—The Farrell Law Firm

(57) ABSTRACT

A high power amplifier having high efficiency, compact and low cost characteristics based on the simple circuit structure effectively used over a wide range of the output power. A control circuit controls power supply operations of the power supply unit such that a high power amplifying unit can act as a low loss resistor that does not amplify the input signal during low power operation of the amplifier, but the high power amplifying unit amplifies the input signal during high power operation.

3 Claims, 4 Drawing Sheets

AMPLIFIER

PRIORITY

This application claims priority to an application entitled "AMPLIFIER" filed in the Japanese Patent Office on Jun. 21, 2004 and assigned Serial No. 2004-182341 and filed in the Korean Intellectual Property Office on Jun. 16, 2005 and assigned Serial No. 2005-51774, the contents of which are hereby incorporated by reference.

BACKGROUND OF THE INVENTION

1. Field of the Invention

The present invention relates to a small-sized, high power amplifier, and more particularly to an amplifier applied to a wireless apparatus, such as a portable terminal, which is operated by a battery.

2. Description of the Related Art

Recently, in a conventional high power amplifier used in the final output stage of a wireless transmitter, characteristics of a high efficiency, a compact size and a low price have become necessary for promoting relatively lower power consumption from the viewpoint of an entire wireless apparatus. Generally, in the conventional amplifier, efficiency decreases at lower output power. In order to constantly maintain high efficiency over a wide range of output powers, it is essentially required to improve efficiency in the lower output power range.

As solutions to this problem, conventional methods include a method for controlling a power source voltage in a high power amplifier and a "bypass method" for switching and bypassing a final stage amplifier which consumes the most electrical power among all the amplifiers.

In order to increase efficiency of the power output, the first conventional method uses a DC-DC converter to control the power source voltage based on an output power.

FIG. 1 illustrates a circuit structure for performing the bypass scheme that is the second conventional method. Referring to FIG. 1, two amplifiers and two switches are connected with each other in a tandem connection. In case of a high power output, all of the two amplifiers 1 and 2 in the first and the second stages operate, whereas in case of a low power output, the amplifier 2 of the second stage is bypassed and turned off to improve the efficiency of power.

The first conventional method is disclosed in Japanese Patent Publication No. 2000-513544 (the primary reference). The primary reference describes that the DC-DC converter is used for controlling the power source in order to realize the first conventional method of achieving efficiency. The DC-DC converter, however, with the peripheral circuits thereof causes the entire apparatus to become bigger in volume as well as to be expensive. Furthermore, the first conventional method has a problem in that the conversion loss of the DC-DC converter tends to increase (i.e., efficiency is lowered) when the output power is lowered (i.e., the power source voltage is lowered). As a result, the structure of combining the amplifier and the DC-DC converter has a problem in the deterioration of the efficiency.

In the second conventional method using the bypass scheme, when the lower power is output, the efficiency is deteriorated to the extent of the power losses of the two switches, as shown in FIG. 1. Each of the two switches, connected to an output of the amplifier 1, generates a certain amount of loss, respectively. Also, the structure for the second method includes the switches that essentially cause the entire structure to increase in both size and cost.

SUMMARY OF THE INVENTION

Accordingly, the present invention has been made to solve the above-mentioned problems occurring in the prior art, and an object of the present invention is to provide an amplifier having characteristics of compact size, lower cost and high efficiency over a wider range of output powers.

In order to accomplish this object, according to one aspect of the present invention, there is provided an amplifier having a first amplifying unit and a second amplifying unit connected in the form of plural stages. The amplifier further includes a power supply unit for supplying power to the second amplifying unit and a control circuit for controlling a power supply of the power supply unit such that the second amplifying unit functions as a low loss path, consuming little power so as to allow an input signal from the first amplifying unit to pass through the low loss path during the low power operation of the amplifier, whereas the second amplifying unit amplifies the input signal during the high power operation of the amplifier.

Preferably, in the amplifier mentioned above, the power supply unit includes a function control power supplier for controlling functions of the second amplifying unit and a DC power supplier, the control circuit controls the DC power supplier to interrupt power supplied to the second amplifying unit, and at the same time, controls the function control power supplier to supply a predetermined power to the second amplifier unit, during the low power operation, whereas the control circuit controls the DC power supplier to supply the power to the second amplifying unit, and at the same time, controls the function control power supplier to supply the predetermined power to the second amplifying unit during the high power operation.

Preferably, in the amplifier mentioned above, the second amplifying unit includes a semiconductor having three terminals of a gate, a drain and a source, the control circuit controls the DC power supplier to interrupt a power supplied to the drain of the second amplifying unit, and at the same time, controls the function control power supplier to supply a 0V voltage to the gate of the second amplifier unit, during the low power operation, whereas the control circuit controls the DC power supplier to supply the power to the drain of the second amplifying unit, and at the same time, controls the function control power supplier to supply the predetermined power to the gate of the second amplifying unit, during the high power operation.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENT

Figure 1:
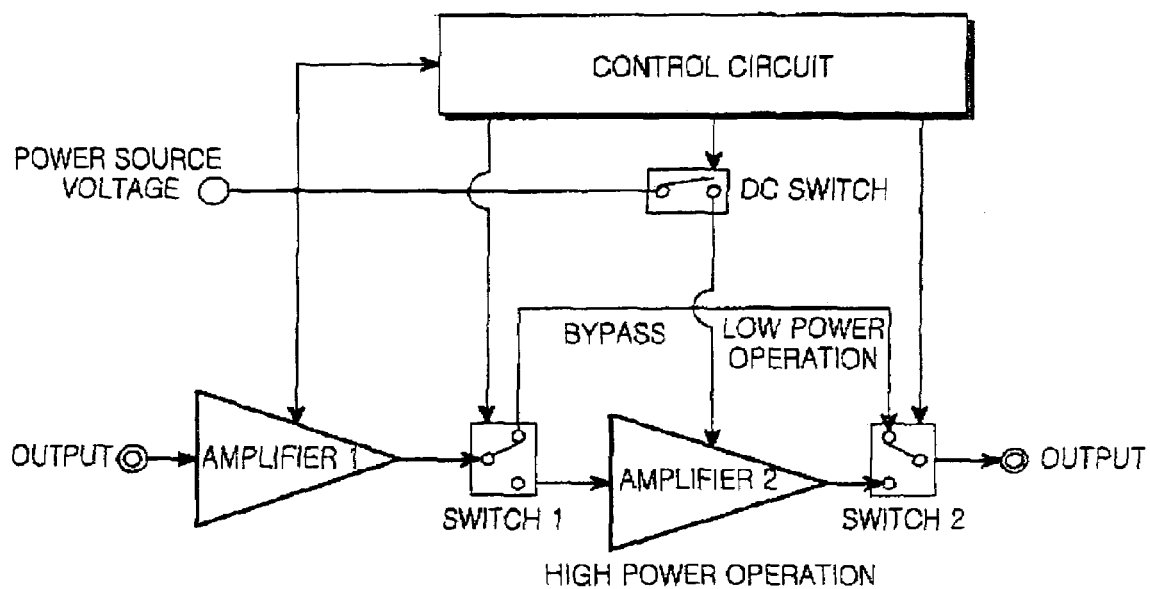
FIG. 1 illustrates a structure for performing a bypass scheme according to a prior art.

Hereinafter, preferred embodiments of the present invention will be described with reference to the accompanying drawings. In the following description, the same or similar elements will be designated by the same reference numerals although they are shown in different drawings. The detailed description of known functions and configurations incorporated herein will be omitted when it may make the subject matter of the present invention unclear.

Figure 2:
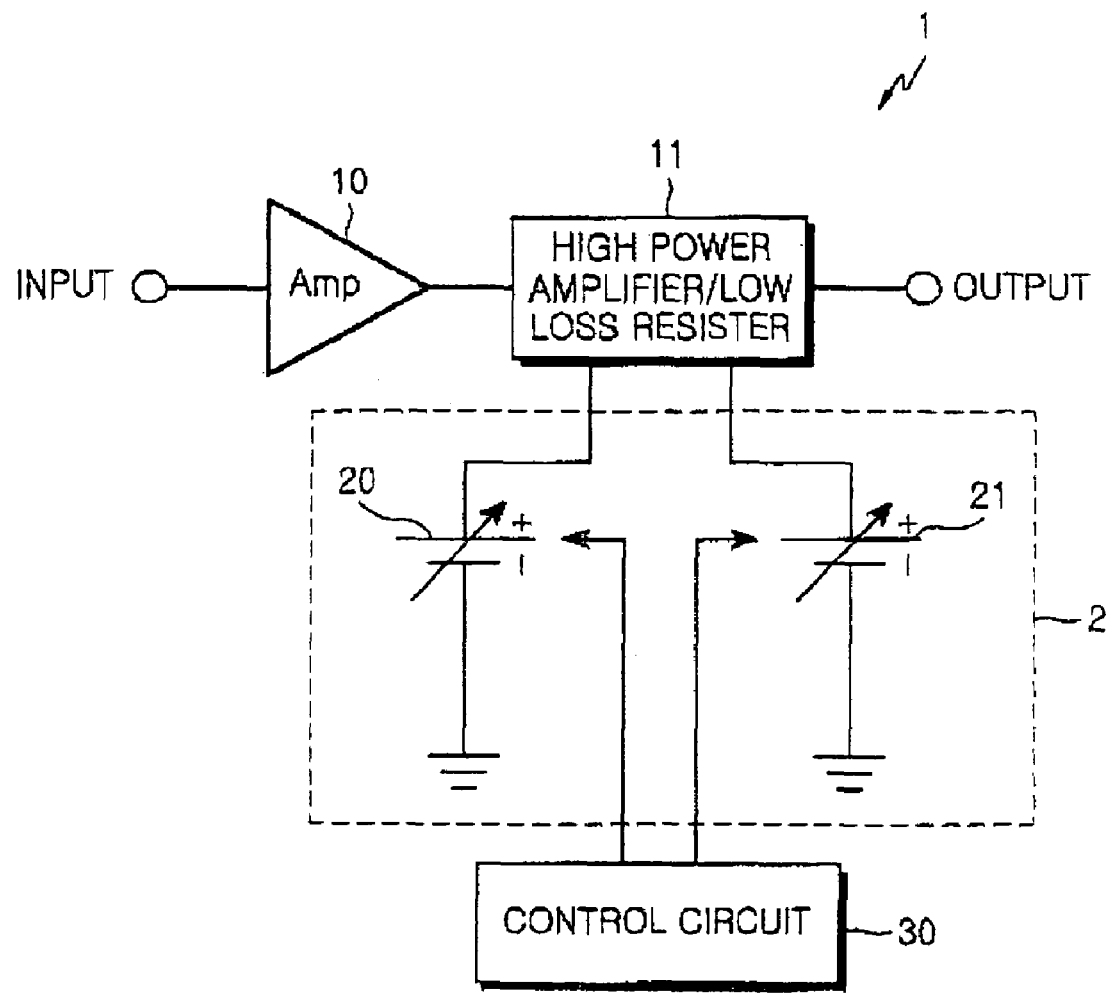
FIG. 2 illustrates a structure of an amplifier according to one embodiment of the present invention.

FIG. 2 illustrates a structure of an amplifier 1 according to one embodiment of the present invention.

As shown in FIG. 2, the amplifier 1 of the present invention includes an amplifying unit 10 connected to the input terminal, and a high power amplifying unit/low loss resistor 11 (hereinafter, referred to as "high power amplifying unit 11") located in the backend stage of the amplifying unit 10. The high power amplifying unit 11 is also connected to a power supply unit 2 for supplying a power used for amplifying an input signal.

The power supply unit 2 is also connected to a control circuit 30 so that the power supply unit 2 may receive a power control signal from the control circuit 30 to supply or interrupt power for the high power amplifying unit 11. Specifically, in accordance with the control signals of the control circuit 30, the power supply 2 does not amplify the input signal when the high power amplifying unit 11 performs a low power operation, whereas the power supply 2 amplifies the input signal when the high power amplifying unit 11 performs the high power operation.

The power supply unit 2 includes a function control power supplier 20 for controlling the functions of the high power amplifying unit 11, and a DC power supplier 21. As shown in FIG. 2, both the function control power supplier 20 and the DC power supplier 21 are connected to the control circuit 30. When the low power operation is performed, the control circuit 30 sends a power control signal to the DC power supplier 21 to interrupt the power to the high power amplifying unit 11. At the same time, the control circuit 30 sends the power control signal to the function control power supplier 20 to supply a predetermined power to the high power amplifying unit 11. Also, when the high power operation is performed, the control circuit 30 controls the DC power supplier 21 to supply the power to the high power amplifying unit 11, while the control circuit 30 controls the function control power supplier 20 to supply a predetermined power to the high power amplifying unit.

Figure 3:
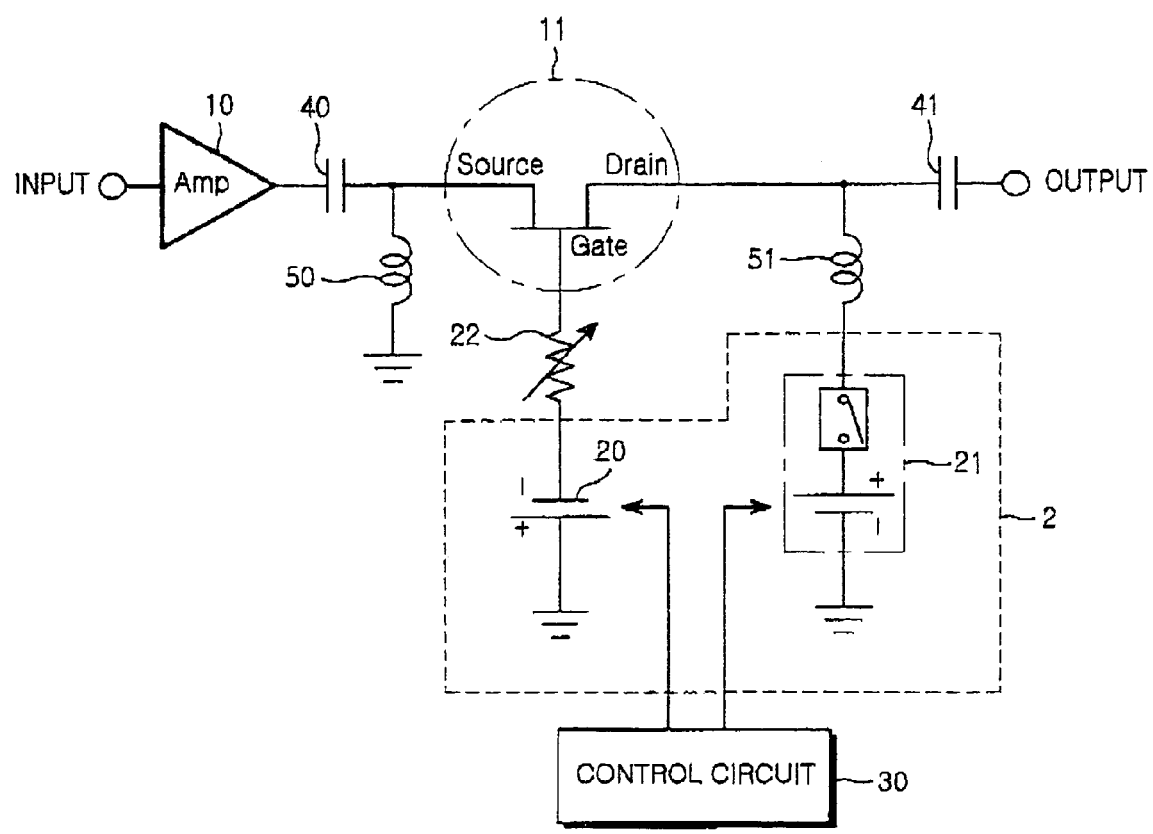
FIG. 3 illustrates a detailed structure of FIG. 2 for explaining an exemplary setup of the amplifier according to one embodiment of the present invention.

Hereinafter, a description will be made about a structure of the amplifier 1 in more detail. FIG. 3 illustrates a detailed structure of FIG. 2 for explaining an exemplary setup of the amplifier according to one embodiment of the present invention. In the amplifier 1, the high power amplifying unit 11 is operated in two modes including a low power mode (or low power operation) and a high power mode (or a high power operation), for improving efficiency over a wider range of output power.

As shown in FIG. 3, a D-mode field effect transistor (FET) or high electron mobility transistor (HEMT) is used for the high power amplifying unit 11 of a final stage according to one embodiment of the present invention.

The high power amplifying unit 11 is a semiconductor device (FET/HEMT) having a gate connected to the ground, a drain, and a source. The control circuit 30 directs the semiconductor device to function as an amplifier in the high power operation, and to be in a through-state of the FET/HEMT switch in the low power operation.

More specifically, in the low power operation, the control circuit 30 directs the DC power supplier 21 to interrupt the power supplied to the drain of the high power amplifying unit 11, and at the same time, directs the function control power supplier 20 to supply 0V voltage to the gate of the high power amplifying unit 11. Whereas, in the high power operation, the control circuit 30 directs the DC power supplier 21 to supply the power to the drain of the high power amplifying unit 11, and, at the same time, directs the function control power supplier 20 to supply a predetermined power to the gate of the high power amplifying unit 11. Further, in the low power operation, a variable resistor 23, which is connected between the high power amplifying unit 11 and the function control power supplier 20, has a resistance value of several Kohm so that the FET/HEMT may function as a pass circuit, while in high power operation, the variable resistor 20 has a resistance value of several ohm so that the FET/HEMT may function as an amplifier. The changes of the resistance values in the variable resistor 20 are controlled by the control circuit 30.

The function control power supplier 20 has a negative (−) terminal connected to the gate of the high power amplifying unit 11 via the variable resistor and a positive (+) terminal connected to the ground. The DC power supplier 21 has a DC switch and a power source. The power source of the DC power supplier 21 has a positive (+) terminal connected to the drain of the high power amplifying unit 11 via the DC switch and a negative (−) terminal connected to the ground.

Referring to FIG. 3, a capacitor 40 is connected in series between the amplifying unit 10 and the high power amplifying unit 11. An inductor 50 is connected on one end to a node between the capacitor 40 and the high power amplifying unit 11 and at the other end of the inductor 50 is connected to the ground.

Capacitor 41 is connected at one end to a node connecting the high power amplifying unit 11 and one end of inductor 51. The other end of capacitor 41 is connected to the output of the overall amplifier device. The other end (opposite to one end connected between the capacitor 41 and the high power amplifying unit 11) of the inductor 51 is connected to the DC switch of the DC power supplier 21.

The FET/HEMT may be of an E-mode type in the amplifier according to one embodiment of the present invention. The polarities of the power suppliers in the D-mode are opposite or reverse to those of the E-mode. In case of the D-mode, the gate voltage is set to 0 V in the low power operation. For high power operation in the D-mode, the gate voltage is set to a predetermined voltage level by which the best efficiency can be obtained in the high power operation. Whereas, in case of the E-mode, the gate voltage is set to a predetermined voltage which causes a drain-source resistance of the FET/HEMT to be minimum (i.e., the FET/HEMT switch is in the through state) in the low power operation. For high power operation in the E-mode, the gate voltage is set to a predetermined voltage level by which the best efficiency can be obtained in the high power operation.

Figure 4:
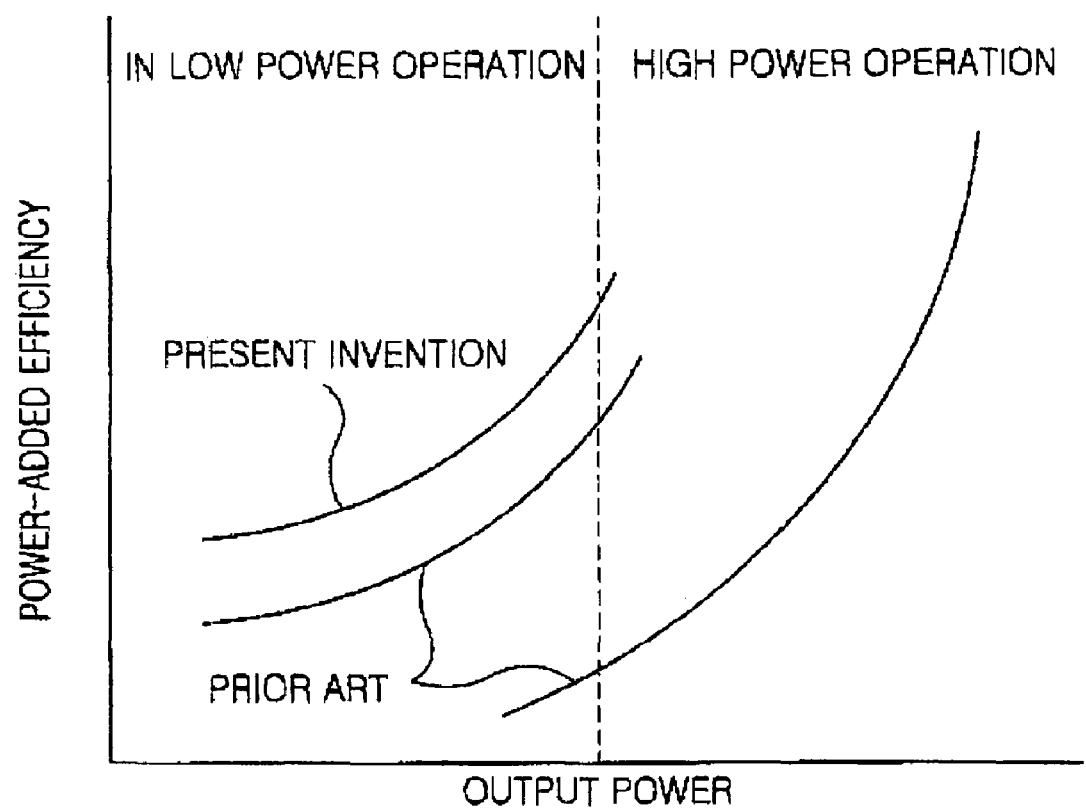
FIG. 4 is a graphical diagram showing a relationship between an output power and a power-added efficiency.

Hereinafter, a description will be made about an operation of the amplifier 1 according to one embodiment of the present invention. FIG. 4 is a graphical diagram showing a relationship between an output power and a power-added efficiency.

First, in the low power operation in which an output power is lower than a desired preset value, if the output power is derived from the forward stage of the amplifying unit 10, then the switch of the high power amplifying unit 11 is changed into the through-state. Specifically, the control circuit 30 outputs a power control signal to the DC power supplier 21 such that the DC switch of the DC power supplier 21 is turned off to interrupt the power supplied to the high power amplifying unit 11. Also, the control circuit 30 outputs another power control signal to the function control power supplier 20 such that 0V voltage can be supplied to the gate of the high power amplifying unit 11.

According to such a control scheme for the power supplied to the high power amplifying unit 11, the high power amplifying unit 11 in the output stage can function as a low loss resistor. Therefore, an input signal, which has been input into the amplifying unit and amplified by the amplifying unit 10, passes through the high power amplifying unit 11 functioning as the low loss resistor mentioned above and outputs to the outside through the output stage (or terminal). Therefore, the amplifier of the present invention can further reduce a loss amount corresponding to one switch and improve the power-added efficiency, as compared to those of the prior art. Also, according to such a control scheme for the power supplied to the high power amplifying unit 11, the relatively higher efficiency can be obtained in the amplifier because the current is not flowing through the amplifying unit which consumes the most power energy.

Second, in high power operation in which an output power is higher than a desired preset value, if the output power is not supplied from the forward stage of the amplifying unit 10, then the high power amplifying unit 11 operates to provide an amplifying unit function. Specifically, the control circuit 30 outputs a power control signal to the DC power supplier 21 such that the DC switch, connected to the drain of the high power amplifying unit 11, is turned on to supply the power to the drain of the high power amplifying unit 11. Also, the control circuit 30 outputs another power control signal to the function control power supplier 20 such that a proper current for the power load can be supplied to the gate of the high power amplifying unit 11.

According to the control scheme for the control circuit 30, the high power amplifying unit 11 can function as an amplifying unit.

The input signal, which has been input from the input terminal into the amplifying unit 10 and amplified by the amplifying unit 10, is further amplified in the high power amplifying unit 11 to be output to the output terminal. Therefore, the amplifier of the present invention can further reduce a power loss amount corresponding to the power loss for one switch and thereby improves the power-added efficiency, as compared to those of the prior art.

As mentioned above, according to one embodiment of the present invention, the amplifier 1 includes the amplifying unit 10 and the high power amplifying unit 11 to control the power supply unit 2 for supplying the power to the high power amplifying unit 11 such that, in the low power operation, the input signals can pass through the high power amplifying unit 11 functioning as the resistor and consuming little power, while in the high power operation, the input signal can be amplified in the high power amplifying unit 11. According to such a structure of the present invention, in the low power operation, only the amplifying unit 10 can be operated even without using the switch, whereas in the high power operation, both the amplifying unit 10 and the high power amplifying unit 11 can be operated.

According to the present invention, the improved efficiency can be obtained over a wider range of the output power, the numbers of the switches on the path of the amplifier can be reduced and the power-added efficiency in the low power operation can be improved.

Furthermore, in the amplifier 1 of the present invention, the additional control circuitry can be formed with a relatively few numbers of elements, as compared to those of the conventional power source voltage control scheme or the conventional bypass scheme. Accordingly, the present invention can provide an amplifier having the compact and low cost characteristics based on the simple circuit structure.

Consequently, lower power consuming, compact and low-cost characteristics can be obtained in the entire wireless apparatus. The present invention can be effectively applied to the wireless apparatus such as the portable terminal which operates by a battery. Also, the amplifier of the present invention can be used for the wireless communication apparatuses using microwaves or millimeter waves.

As mentioned above, in the amplifier in which a first amplifying unit and a second amplifying unit are connected in the form of a plural stages, the amplifier has a power supply unit for supplying power to the second amplifying unit, and a control circuit for controlling power supply of the power supply unit such that the second amplifying unit functions as a low loss path consuming little power so as to allow an input signal from the first amplifying unit to pass through the low loss path during the low power operation of the amplifier, whereas the second amplifying unit amplifies the input signal during the high power operation of the amplifier.

In such an amplifier according to the present invention, in the low power operation, only the first amplifying unit is operated, whereas in the high power operation, both the first and the second amplifying units are all operated.

Accordingly, the present invention can obtain an effect in that the higher efficiency over a wider range of the output power is maintained, and the switch-based loss and deterioration due to the loss can be prevented because the switch may not be used in the amplifying unit.

In another embodiment of the present invention, the power supply unit includes a function control power supplier for controlling functions of the second amplifying unit and a DC power supplier, the control circuit controls the DC power supplier to interrupt power supplied to the second amplifying unit, and at the same time, controls the function control power supplier to supply a predetermined power to the second amplifier unit, during the low power operation, whereas the control circuit controls the DC power supplier to supply the power to the second amplifying unit, and at the same time, controls the function control power supplier to supply the predetermined power to the second amplifying unit, during the high power operation, According to such a structure, when the amplifier is in the low power operation, only the function control power supplier can be operated without the operation of the second amplifying unit, whereas when the amplifier is in the high power operation, the DC power supplier supplies the power to the second amplifying unit through which the current of the power can be flown.

Consequently, during the low power operation of the amplifier, a high efficiency of the amplifying operation can be obtained owing to the interruption of current in the amplifying unit.

In another further embodiment of the present invention, the second amplifying unit includes a semiconductor having three terminals of a gate, a drain and a source, and the control circuit controls the DC power supplier to interrupt a power supplied to the drain of the second amplifying unit, and at the same time, controls the function control power supplier to supply a 0V voltage to the gate of the second amplifier unit, during the low power operation, whereas the control circuit controls the DC power supplier to supply the power to the drain of the second amplifying unit, and at the same time, controls the function control power supplier to supply the predetermined power to the gate of the second amplifying unit, during the high power operation.

According to such a structure, the second amplifying unit can function as a low loss resistor during the low power operation, and as an amplifying unit itself during the high power operation.

Accordingly, the present invention can provide a high power amplifier having the high efficient, compact and low cost characteristics based on the simple circuit structure effectively in wider range of the output power.

While the invention has been shown and described with reference to certain preferred embodiments thereof, various changes in forms and details may be made within the scope of the present invention. Accordingly, the scope of the present invention should not be limited to the embodiments described in the specification but to the appended claims or its equivalents.

What is claimed is:

1. An amplifier comprising a first amplifying unit and a second amplifying unit connected in plural stages, the amplifier further comprising:
    a power supply unit for supplying a power to the second amplifying unit; and
    a control circuit for controlling a power supply of the power supply unit such that the second amplifying unit functions as a low loss path having zero gain and consuming little power so as to allow an input signal from the first amplifying unit to pass through the low loss path during low power operation of the amplifier, whereas the second amplifying unit amplifies the input signal during high power operation of the amplifier.

2. The amplifier as claimed in claim 1, wherein the power supply unit comprises a function control power supplier for further controlling functions of the second amplifying unit and a DC power supplier, wherein
    the control circuit controls the DC power supplier to interrupt a power supplied to the second amplifying unit, and at the same time, controls the function control power supplier to supply a predetermined power to the second amplifier unit, during low power operation, whereas the control circuit controls the DC power supplier to supply the power to the second amplifying unit, and at the same time, controls the function control power supplier to supply the predetermined power to the second amplifying unit during high power operation.

3. The amplifier as claimed in claim 2, wherein the second amplifying unit includes a semiconductor having a gate, a drain and a source, wherein
    the control circuit controls the DC power supplier to interrupt a power supplied to the drain of the second amplifying unit, and at the same time, controls the function control power supplier to supply a 0V voltage to the gate of the second amplifier unit, during low power operation, whereas the control circuit controls the DC power supplier to supply the power to the drain of the second amplifying unit, and at the same time, controls the function control power supplier to supply the predetermined power to the gate of the second amplifying unit, during high power operation.

* * * * *